United States Patent [19]

Kanematsu et al.

[11] 4,267,480
[45] May 12, 1981

[54] ELECTRO-CONDUCTIVE ELASTOMERIC PAD FOR PIEZOELECTRIC DEVICE

[75] Inventors: Tetsuo Kanematsu, Hakui; Tsuneo Taki, Toyonaka, both of Japan

[73] Assignee: Murata Manufacturing Co., Ltd., Kyoto, Japan

[21] Appl. No.: 41,913

[22] Filed: May 23, 1979

[30] Foreign Application Priority Data

Feb. 6, 1978 [JP] Japan ................................ 53/67149

[51] Int. Cl.³ .......................................... H01L 41/08
[52] U.S. Cl. .................................. 310/366; 310/364; 310/363; 310/345; 310/354
[58] Field of Search ............... 310/348, 366, 354–356, 310/363, 364, 345; 333/183, 185, 186

[56] References Cited

U.S. PATENT DOCUMENTS

| | | | |
|---|---|---|---|
| 3,495,105 | 2/1970 | Shimano | 310/366 |
| 3,836,794 | 9/1974 | Shimizu et al. | 310/364 |
| 3,851,194 | 11/1974 | Kawada | 310/364 |

FOREIGN PATENT DOCUMENTS 4423196  6/1966  Japan ....................................... 310/363

Primary Examiner—Mark O. Budd

[57] ABSTRACT

A piezoelectric resonator comprises a piezoelectric substrate, a common electrode layer applied on one major surface of the piezoelectric substrate, and at least one electrode layer applied on its second major surface. The piezoelectric substrate is held in position between two or more metallic terminal elements, with the electrode layers held in electrical contact with the terminal elements. The piezoelectric resonator further comprises at least one direction-oriented electroconductive sheet positioned between the electrode layer on the second major surface of the piezoelectric substrate and the associated terminal element. The direction-oriented electroconductive plastic sheet has substantial electroconductivity only across its thickness.

8 Claims, 6 Drawing Figures

ELECTRO-CONDUCTIVE ELASTOMERIC PAD FOR PIEZOELECTRIC DEVICE

BACKGROUND OF THE INVENTION

The present invention generally relates to a piezoelectric device and, more particularly, to a piezoelectric resonator utilizing a direction-oriented electroconductive plastic sheet.

The term "direction-oriented electroconductive plastic sheet" is to be understood herein as meaning an electroconductive plastic sheet having such a property as to exhibit an electroconductivity in a predetermined direction across the thickness of the plastic sheet, in contrast to an ordinary electroconductive plastic sheet which exhibits its electroconductivity isotropically. The direction-oriented electroconductive plastic sheet is a recent development and a very few years have passed since it was made available commercially. The direction-oriented electroconductive plastic sheet is generally made of a sheet of silicone rubber containing electroconductive material, for example, metallic particles, carbon particles or metallic fibers, dispersed therein in a predetermined arrangement, and is currently commercially available in two types: one is an anisotropically electroconductive plastic sheet capable of exhibiting its electroconductivity only in a predetermined direction across the thickness of the plastic sheet while the other is a pressure-conductive plastic sheet which is similar in property to that of the anisotropically electroconductive plastic sheet, but requires the application of pressure to establish the electroconductivity across its thickness.

The present invention pertains to a utilization of the direction-oriented electroconductive plastic sheet in a piezoelectric device as a connector element.

There is known a piezoelectric device, for example, a piezoelectric resonator, utilizing a face vibration mode or a radial vibration mode, an example of which is shown in FIG. 1 of the accompanying drawings in side elevational view. Referring to FIG. 1, the conventional piezoelectric resonator comprises a piezoelectric substrate 1 of a plate-like configuration having its opposed surfaces coated or deposited with electrode layers 6 and 7, and a pair of metallic terminal elements 2 and 3 having respective protuberances 4 and 5. This piezoelectric substrate 1 is supported in position between the metallic terminal members 2 and 3 by the protuberances 4 and 5 contacting the electrode layers 6 and 7 at respective positions corresponding to nodes of vibrations of the piezoelectric substrate 1.

In the conventional piezoelectric device, in order for the piezoelectric substrate 1 to be securely supported and to be securely electrically connected to the metallic terminal elements 2 and 3, the metallic terminal elements 2 and 3 are resilient enough to urge the protuberances 4 and 5 against the piezoelectric substrate 1 through the associated electrode layers 6 and 7 and to hold the piezoelectric substrate 1 in position. However, in view of the particular supporting system and the limited types of material that can be used in it, the conventional piezoelectric resonator has no room for improvement as to protection against vibrations and/or impacts.

In order to render the piezoelectric resonator resistant to vibration and impact, it has heretofore been suggested to use additionally an elastic polymer compound, such as a synthetic rubber, or a spring element, or to utilize terminal elements of electroconductive polymer compound in place of the metallic terminal elements.

Japanese Laid-open Patent Publication No. 52-110547 and Japanese Laid-open Utility Model Publications No. 52-122630, No. 52-122631 and No. 52-122632, all of which were laid open to public inspection in 1977, each disclose a piezoelectric resonator of a type having three terminal elements and utilizable as a filter. In this prior art piezoelectric resonator having first, second and third terminal elements, one of the opposed surfaces of the piezoelectric substrate is coated or deposited with a common electrode layer over its entire surface and is electrically connected to the first terminal element through an elastic protuberance protruding outwards from the first terminal element and contacting the common electrode layer. The other surface of the same piezoelectric substrate is provided with a central electrode layer and a second electrode layer electrically insulated from and encircling the central electrode layer, both of which are electrically connected respectively to the second and third terminal elements through corresponding elastic protuberances which protrude outwards from the second and third terminal elements and contact the central and surrounding electrode layers, respectively.

Even in this prior art piezoelectric resonator of the type having the three terminal elements, all of the terminal elements are made of a resilient metallic material, since there has been no method for supporting the piezoelectric substrate other than relying on the resiliency of the terminal elements.

On the other hand, some manufacturers of piezoelectric resonators are exposed to severe competition and must, therefore, minimize manufacturing costs while improving the performance of their products. In view of this, it has long been desired to provide high quality piezoelectric resonators that are simple in construction and the manufacture of which can be automated.

SUMMARY OF THE INVENTION

Accordingly, the present invention has been developed with a view to substantially eliminating the disadvantages and inconveniences inherent in the prior art piezoelectric resonators and has for its essential object to provide an improved piezoelectric resonator with improved resistance to vibration and impact.

Another important object of the present invention is to provide an improved piezoelectric resonator of the type referred to above, wherein there is utilized at least one direction-oriented electroconductive plastic sheet and wherein, in the case where a plurality of electrode layers are provided on at least one face of the piezoelectric substrate and the direction-oriented electroconductive plastic sheet is placed in contact with all of the electrode layers, there is no possibility of electric short-circuiting between any two of the electrode layers.

A further object of the present invention is to provide an improved piezoelectric resonator of the type referred to above, wherein the piezoelectric substrate is firmly and steadily held in position.

A still further object of the present invention is to provide an improved piezoelectric resonator of the type referred to above the manufacture of which can be automated without the performance of the product being lowered.

A still further object of the present invention is to provide an improved piezoelectric resonator of the type referred to above, wherein the supporting system for the piezoelectric substrate is effective to compensate for any possible error in the positioning of the various components, particularly the terminal elements, of the piezoelectric resonator.

A still further object of the present invention is to provide an improved piezoelectric resonator of the type referred to above the manufacturing cost of which is lowered by a reduction of the thickness of the electrode layers without the performance of the piezoelectric resonator being lowered thereby.

A still further object of the present invention is to provide an improved piezoelectric resonator of the type referred to above, capable of exhibiting an improved shape factor without its characteristic being substantially damped.

The improved piezoelectric resonator of the invention comprises a piezoelectric substrate, first and second electrode layers formed respectively on the opposed major faces of the piezoelectric substrate, and first and second electroconductive terminal members, each having a protruding contact element. The piezoelectric substrate is supported in position between the first and second terminal members by means of the respective contact elements, which contact respectively the first and second electrode layers.

In accordance with the present invention, the improved piezoelectric resonator further comprises at least one direction-oriented electroconductive sheet positioned between the first electrode layer and the first terminal member.

Since the direction-oriented electroconductive sheet itself is pliable, any vibration or impact applied to the metallic terminal members can be absorbed by the direction-oriented electroconductive plastic wheet without being transmitted to the piezoelectric substrate, thereby improving the resistance of the piezoelectric resonator to the vibration or impact. In other words, the direction-oriented electroconductive plastic sheet so employed serves as a cushioning element.

BRIEF DESCRIPTION OF THE DRAWINGS

These and other objects and features of the present invention will become apparent from the following description of the preferred embodiments thereof, taken in conjunction with the accompanying drawings, in which.

DETAILED DESCRIPTION OF THE INVENTION

Figure 1:
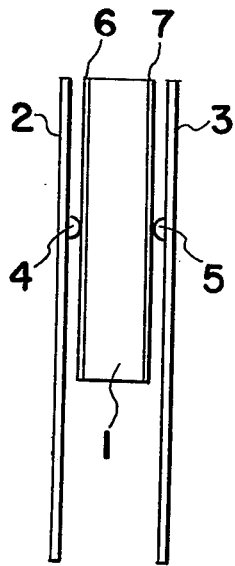
FIG. 1 is a side elevational view of the prior art piezoelectric resonator, reference to which has been made.

Before the description of the present invention proceeds, it is to be noted that like parts are designated by like reference numerals throughout the accompanying drawings.

Figure 2:
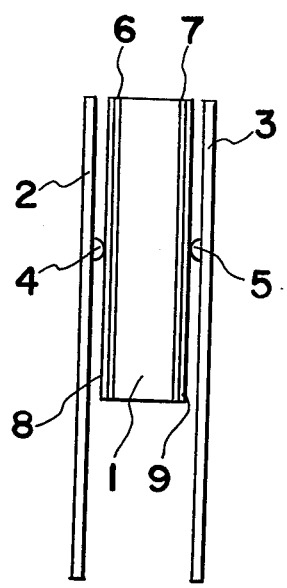
FIG. 2 is a side elevational view of a piezoelectric resonator according to one preferred embodiment of the present invention.

As can readily be understood from the comparison of FIG. 2 with FIG. 1, the piezoelectric resonator shown in FIG. 2 and constructed according to the present invention is similar in construction to the prior art piezoelectric resonator, but has anisotropically electroconductive plastic sheets 8 and 9 positioned respectively between the metallic terminal element 2 and the electrode layer 6 and between the metallic terminal element 3 and the electrode layer 7. These anisotropically electroconductive plastic sheets 8 and 9 are shown as being held flat against the respective electrode layers 6 and 7 and are supported in position, together with the piezoelectric substrate 1, by means of the metallic terminal elements 2 and 3, which apply respective resilient forces thereto through protuberances 4 and 5.

However, the anisotropically electroconductive plastic sheets 8 and 9 may not be always held flat against the electrode layers 6 and 7 such as shown in FIG. 2, but may be warped, with their perimeters separated from the respective electrode layers 6 and 7. This can be accomplished by applying more resilient force to the piezoelectric substrate 1 through protuberances 4 and 5 than is required to hold the plastic sheets 8 and 9 flat against the electrode layers 6 and 7 as shown in FIG. 2, because the direction-oriented electroconductive plastic sheet has the property of tending to warp under pressure applied.

Figure 3:
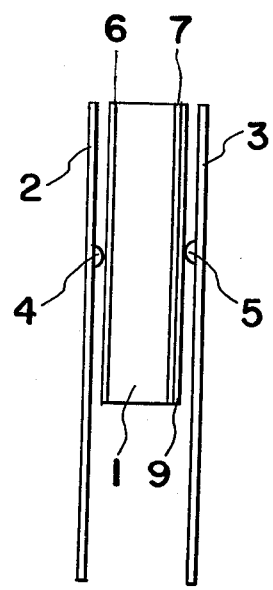
FIG. 3 is a side elevational view of a modified form of the piezoelectric resonator shown in FIG. 2.

It is also to be noted that one direction-oriented electroconductive plastic sheet will suffice, as shown in FIG. 3.

Furthermore, more than one electrode layer may be provided on one or both of the opposed faces of the piezoelectric substrate 1, as will now be described with reference to FIGS. 4 and 5.

Figure 4:
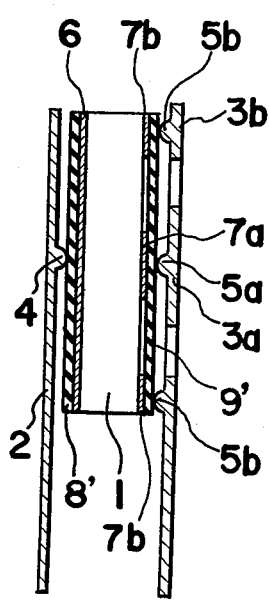
FIG. 4 is a side sectional view of the piezoelectric resonator according to another preferred embodiment of the present invention.

Referring first to FIG. 4, there is shown an example of piezoelectric resonator having a plurality of electrode layers, for example three layers 6, 7a and 7b. One face of the square piezoelectric substrate 1 has the electrode layer 6, and the other major face has a center electrode layer 7a and a surrounding electrode layer 7b electrically insulated from each other. The surrounding electrode layer 7b surrounds and is concentric with the center electrode layer 7a. These electrode layers 7a and 7b are electrically connected to respective terminal elements 3a and 3b through a common anisotropically electroconductive plastic sheet 9' of a size equal to the surface area of the major face of the piezoelectric substrate 1 on which the center and surrounding electrode layers 7a and 7b are formed. While the metallic terminal element 3a has a single protuberance 5a, the terminal element 3b, which is similar in shape to the shape of the surrounding electrode layer 3b, has a plurality of protuberances 5b, which are preferably equally spaced from each other around the perimeter of terminal element 3b.

As is the case with the embodiment shown in FIG. 2, the protuberances 5a and 5b tightly contact the center and surrounding electrode layers 7a and 7b, respectively, through the common anisotropically electroconductive plastic sheet 9'. Even though the electroconductive plastic sheet 9' is of a size sufficient to physically connect the center electrode layer 7a to the surrounding electrode layer 7b and also the terminal element 3a to the terminal element 3b, electrical contact is established only between the center electrode layer 7a and the terminal element 7a, and between the surrounding electrode layer 3b and the terminal element 7b. This is because of the unique electroconductive property of the anisotropically electroconductive plastic sheet 9', which is electroconductive only in a direction across its thickness.

Figure 5:
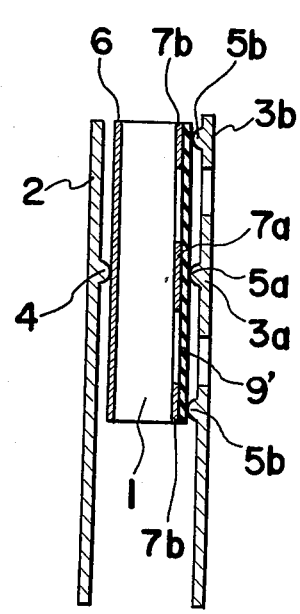
FIG. 5 is a view similar to FIG. 4, showing a modified form of the piezoelectric resonator shown in FIG. 4.

A second direction-oriented electroconductive layer 8' may, if desired, be provided on electrode layer 6, as shown in FIG. 4, but this feature is optional (see FIG. 5).

In the embodiments of FIGS. 4 and 5, if an ordinary isotropic electroconductive plastic sheet were employed in place of the anisotropically electroconductive plastic sheet 9', the center and surrounding electrode layers 7a and 7b would obviously be electrically short-circuited. Therefore, in the piezoelectric resonator of the type having a plurality of electrodes on one face of the piezoelectric substrate, the use of the ordinary electroconductive plastic sheet must be strictly avoided.

The employment of the at least one anisotropically electroconductive plastic sheet in the piezoelectric resonator according to the present invention has the following advantages over conventional resonators.

(1) Since there is no direct contact between the protuberance 4, 5a, 5b and the associated electrode layer 6, 7a, 7b such as is required in the prior art piezoelectric resonator shown in FIG. 1, there is no possibility of the electrode layer being damaged.

(2) In the prior art piezoelectric resonator, the electrode layers must be relatively thick, in anticipation of physical damage which may be brought about by the direct contact of the protuberance with the electrode layers. However, in the present invention, since there is no possibility of damage to the electrode layers, as stated above, and since the anisotropically electroconductive plastic sheet itself serves as a cushioning element, the electrode layers may be relatively thin.

(4) Since relatively thin electrode layers are employable in the present invention, relatively little of the expensive material used for the electrode layers is needed, and the manufacturing cost of the piezoelectric resonator according to the present invention can be minimized.

(5) Furthermore, reduction in thickness of the electrode layers facilitates oscillation of the piezoelectric substrate. Therefore, a piezoelectric resonator having a greatly improved performance characteristic can readily be manufactured.

(6) Since the anisotropically electroconductive plastic sheet serves as a cushioning element, as described above, the resistance of the piezoelectric resonator to vibration and impact can be improved.

(7) As compared with the conventional method of manufacturing the prior art piezoelectric resonator, the present invention requires only one extra step, namely that of providing the anisotropically electroconductive plastic sheet. Even with this extra manufacturing step, the method of the present invention is believed to be simpler than the prior art method as disclosed in the Japanese Laid-open Utility Model Publication No. 52-60278, laid open to public inspection in 1977. This last-mentioned publication discloses the use of an electroconductive polymer compound as a material for the protuberances, which must be subsequently bonded to the associated terminal element. There is also disclosed coating the electroconductive polymer compound on the metallic terminal element.

Figure 6:
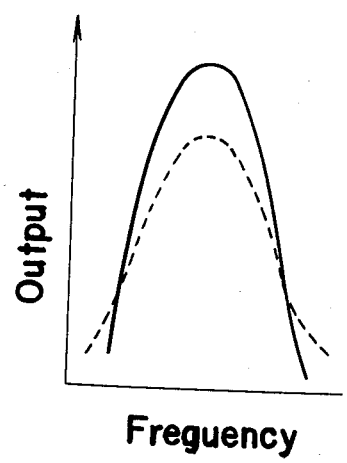
FIG. 6 is a graph showing a frequency-output characteristic of the piezoelectric resonator shown in FIG. 5.

(8) As can readily be understood from the graph shown in FIG. 6, the piezoelectric resonator according to the present invention exhibits an excellent shape factor, as shown by the solid line, in contrast to that of the prior art piezoelectric resonator, shown by the broken line.

In practice, the assemblies shown in FIGS. 2 to 5 are encapsulated or encased, as is well known to those skilled in the art. Moreover, while in describing the preferred embodiments of the present invention the use of the anisotropically electroconductive plastic sheet has been mentioned, it may be replaced with a pressure-conductive plastic sheet that exhibits an electroconductive property similar to that of the anisotropically electroconductive plastic sheet, but that requires the application of pressure to establish the electroconductivity.

Although the present invention has been fully described in connection with the preferred embodiments thereof with reference to the accompanying drawings, many variations and modifications will now be apparent to those skilled in the art. The scope of this invention is therefore to be limited, not by the details of the preferred embodiments described herein, but only by the terms of the appended claims.

What is claimed is:

1. A piezoelectric resonator, comprising:
   a piezoelectric substrate having first and second major opposed surfaces;
   first and second electrode layers formed on said first surface of said substrate and being electrically isolated from each other;
   a third electrode layer formed on said second surface of said substrate;
   first and second electroconductive terminal members each having an inner face and a contact element protruding therefrom, said first and second electroconductive terminal members being electrically isolated from each other;
   a third electroconductive terminal member having an inner face and a contact element protruding therefrom, said contact element of said third electroconductive terminal member being in electrical contact with said third electrode layer; said first, second and third electroconductive terminal members cooperating with each other to maintain said piezoelectric substrate in position therebetween;
   a unitary direction-oriented electroconductive plastic sheet disposed on and in electrical contact with said first and second electrode layers and between said first and second electrode layers and said contact elements of said first and second electroconductive terminal members, said electroconductive plastic sheet being conductive only in the direction perpendicular to said first major surface, and said first and second terminal members being so located that they are in electrical contact with said first and second electrode layers, respectively, through different, non-overlapping portions of said direction-oriented electroconductive plastic sheet, said electroconductive plastic sheet acting as a cushioning element interfacing said first and second terminal member and said first and second electrode layers, respectively.

2. A piezoelectric resonator as claimed in claim 1, wherein said direction-oriented electroconductive plastic sheet is an anisotropically electroconductive plastic sheet.

3. A piezoelectric resonator as claimed in claim 2, wherein said additional direction-oriented electroconductive plastic sheet is also an anisotropically electroconductive plastic sheet.

4. A piezoelectric resonator as claimed in claim 1, wherein said direction-oriented electroconductive plastic sheet is a pressure-conductive plastic sheet.

5. A piezoelectric resonator as claimed in claim 4, wherein said additional direction-oriented electroconductive plastic sheet is also a pressure-conductive plastic sheet.

6. A piezoelectric resonator as claimed in claim 1, further comprising an additional direction-oriented electroconductive plastic sheet disposed between and in mechanical and electrical contact with both said contact element of said third electrode layer and said third terminal member, said additional electroconducive plastic sheet being conductive only in a direction perpendicular to said second major opposed surface and acting as a cushioning element interfacing said third electrode layer and said third terminal member.

7. A piezoelectric resonator as claimed in claim 6, wherein said additional direction-oriented electroconductive plastic sheet is an anisotropically electroconductive plastic sheet.

8. A piezoelectric resonator as claimed in claim 6, wherein said additional direction-oriented electroconductive plastic sheet is a pressure-conductive plastic sheet.

* * * * *